US012604677B2

(12) United States Patent
Sung

(10) Patent No.: US 12,604,677 B2
(45) Date of Patent: Apr. 14, 2026

(54) SEMICONDUCTOR DEVICE AND METHODS OF MANUFACTURING

(71) Applicant: Taiwan Semiconductor Manufacturing Company, Ltd., Hsinchu (TW)

(72) Inventor: Fu-Ting Sung, Yangmei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 586 days.

(21) Appl. No.: 18/162,299

(22) Filed: Jan. 31, 2023

(65) Prior Publication Data

US 2024/0112987 A1 Apr. 4, 2024

Related U.S. Application Data

(60) Provisional application No. 63/378,191, filed on Oct. 3, 2022.

(51) Int. Cl.
H10N 70/00 (2023.01)
H01L 23/48 (2006.01)
H10B 63/00 (2023.01)

(52) U.S. Cl.
CPC ......... H10N 70/826 (2023.02); H01L 23/481 (2013.01); H10B 63/30 (2023.02); H10N 70/011 (2023.02)

(58) Field of Classification Search
CPC .... H10N 70/826; H10N 70/011; H10B 63/30; H01L 23/481
See application file for complete search history.

(56) References Cited

U.S. PATENT DOCUMENTS

2020/0098985 A1* 3/2020 Trinh ................... H10N 70/826
2022/0102428 A1* 3/2022 Chiu ..................... H10B 63/30

* cited by examiner

*Primary Examiner* — Peter M Albrecht
(74) *Attorney, Agent, or Firm* — Harrity & Harrity, LLP

(57) ABSTRACT

A cell structure of a memory device includes an upper electrode structure separated from a metal line above the cell structure by a combination of one or more layers including an isolation layer. The cell structure may be patterned using a metal line below the cell structure as an etch-stop layer. Relative to other techniques that include patterning the cell structure using a silicon carbide layer located over the metal line below the cell structure as an etch-stop layer, the techniques described herein may reduce an overall height of the memory structure. Additionally, or alternatively, the techniques may maintain or increase an isolation distance between the metal line above the cell structure and the upper electrode structure. In this way, a likelihood of shorting between the metal line above the cell structure and the upper electrode structure is reduced to improve a performance and/or a reliability of the memory device.

20 Claims, 11 Drawing Sheets

200 ⟶

500

510    Form a dielectric layer on a metal structure

520    Remove portions of the dielectric layer to expose a landing region on a top surface of the metal structure 530    Form one or more layers of a cell structure over the metal structure and the dielectric layer 540    Remove portions of the one or more layers to form the cell structure

SEMICONDUCTOR DEVICE AND METHODS OF MANUFACTURING

CROSS-REFERENCE TO RELATED APPLICATION

This patent application claims priority to Provisional Patent Application No. 63/378,191 filed on Oct. 3, 2022, and entitled "Semiconductor Device and Methods of Manufacturing." The disclosure of the prior application is considered part of and is incorporated by reference into this patent application.

BACKGROUND

An advanced semiconductor device, such as a resistive random access memory (RRAM device, may include a memory structure having a cell structure between an upper metal line structure and a lower metal line structure. The memory structure may be included in a middle end of line (MEOL) region that electrically connects transistors in a front end of line (FEOL) region to a back end of line (BEOL) region of the advanced semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
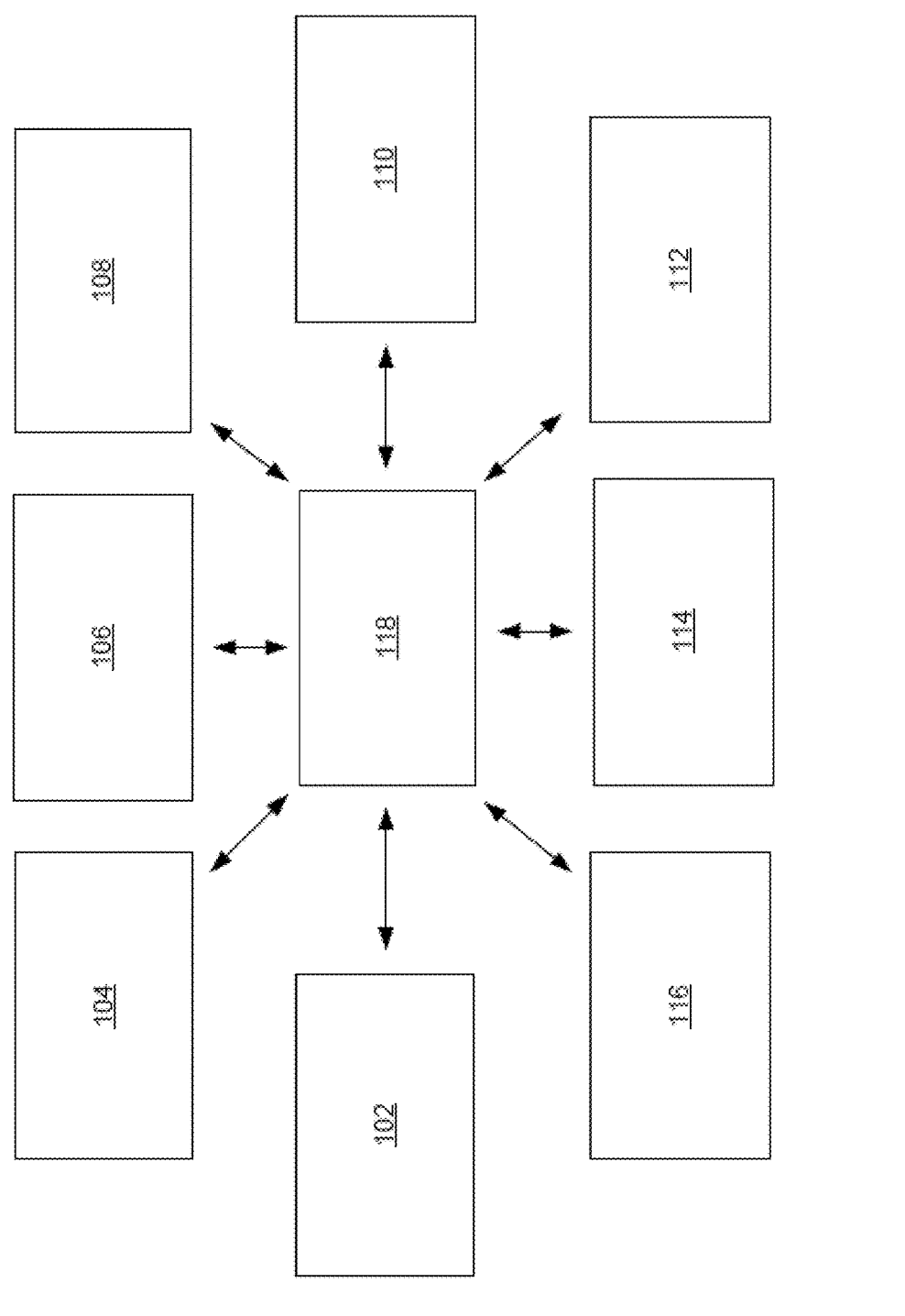
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, techniques to form a memory structure of an RRAM device may include forming a layer of a silicon carbide material within the memory structure. During formation of a cell structure within the memory structure, the layer of silicon carbide material may be used as an etch stop Patterning and etching techniques that use layer of silicon carbide material as an etch stop to form the cell structure may reduce an isolation distance between an upper electrode structure of the cell structure and a metal line above the cell structure. In such case, a likelihood of shorting between the metal line above the cell structure and the upper electrode structure (e.g., electron tunneling through an isolation layer between the metal line above the cell structure and the upper electrode structure) may increase, which may result in reduced overall functionality of the memory device and/or a failure in the memory device.

Some implementations described herein include a memory device and techniques of formation. A cell structure of the memory device includes an upper electrode structure that is separated from a metal line above the cell structure by a combination of one or more layers including an isolation layer. The techniques include patterning the cell structure using a metal line below the cell structure as an etch stop.

Relative to other techniques that include patterning the cell structure using a silicon carbide layer located over the metal line below the cell structure as an etch stop, techniques that include patterning the cell structure using the metal line below the cell structure as an etch stop reduce an overall height of the memory structure. Additionally, or alternatively, the techniques may maintain or increase an isolation distance between the metal line above the cell structure and the upper electrode structure. In this way, a likelihood of shorting between the metal line above the cell structure and the upper electrode structure is reduced to improve a performance and/or a reliability of the memory device.

FIG. 1 is a diagram of an example environment 100 in which systems and/or methods described herein may be implemented. As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a developer tool 106, an etch tool 108, a planarization tool 110, a plating tool 112, a pre-treatment tool 114, a plasma tool 116, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The pre-treatment tool 114 is a semiconductor processing tool that is capable of using various types of wet chemicals and/or gasses to treat the surface of one or more layers of a device in preparation for one or more subsequent semiconductor processing operations. For example, the pre-treatment tool 114 may include a chamber in which a device may be placed. The chamber may be filled with a wet chemical and/or a gas that is used to modify the physical and/or chemical properties of one or more layers of a device.

The plasma tool 116 is a semiconductor processing tool, such as a decoupled plasma source (DPS) tool, an inductively coupled plasma (ICP) tool, a transformer coupled plasma (TCP) tool, or another type of plasma-based semiconductor processing tool, that is capable of treating the surface of one or more layers of a device using a plasma. For example, the plasma tool 116 may sputter etch or otherwise remove material from the surface of a layer of a device using plasma ions.

Wafer/die transport tool 118 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-116, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 118 may be a programmed device that is configured to travel a particular path and/or may operate semi-autonomously or autonomously. In some implementations, the environment 100 includes a plurality of wafer/die transport tools 118.

For example, the wafer/die transport tool 118 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 118 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 118 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

As described in connection with FIGS. 2A-5, and elsewhere herein, the one or more semiconductor processing tools 112-116 may perform a series of manufacturing operations. The series of manufacturing operations includes forming a dielectric layer on a metal structure. The series of manufacturing operations includes removing portions of the dielectric layer to expose a landing region on a top surface of the metal structure, where removing the portions of the dielectric layer forms convex-shaped surfaces in the dielectric layer that are adjacent to the landing region, and where the convex-shaped surfaces overlap edges of the metal structure. The series of manufacturing operations includes forming one or more layers of a cell structure over the metal structure and the dielectric layer, where a bottom layer of the one or more layers is on the landing region and on the dielectric layer. The series of manufacturing operations includes removing portions of the one or more layers to form the cell structure.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2A:
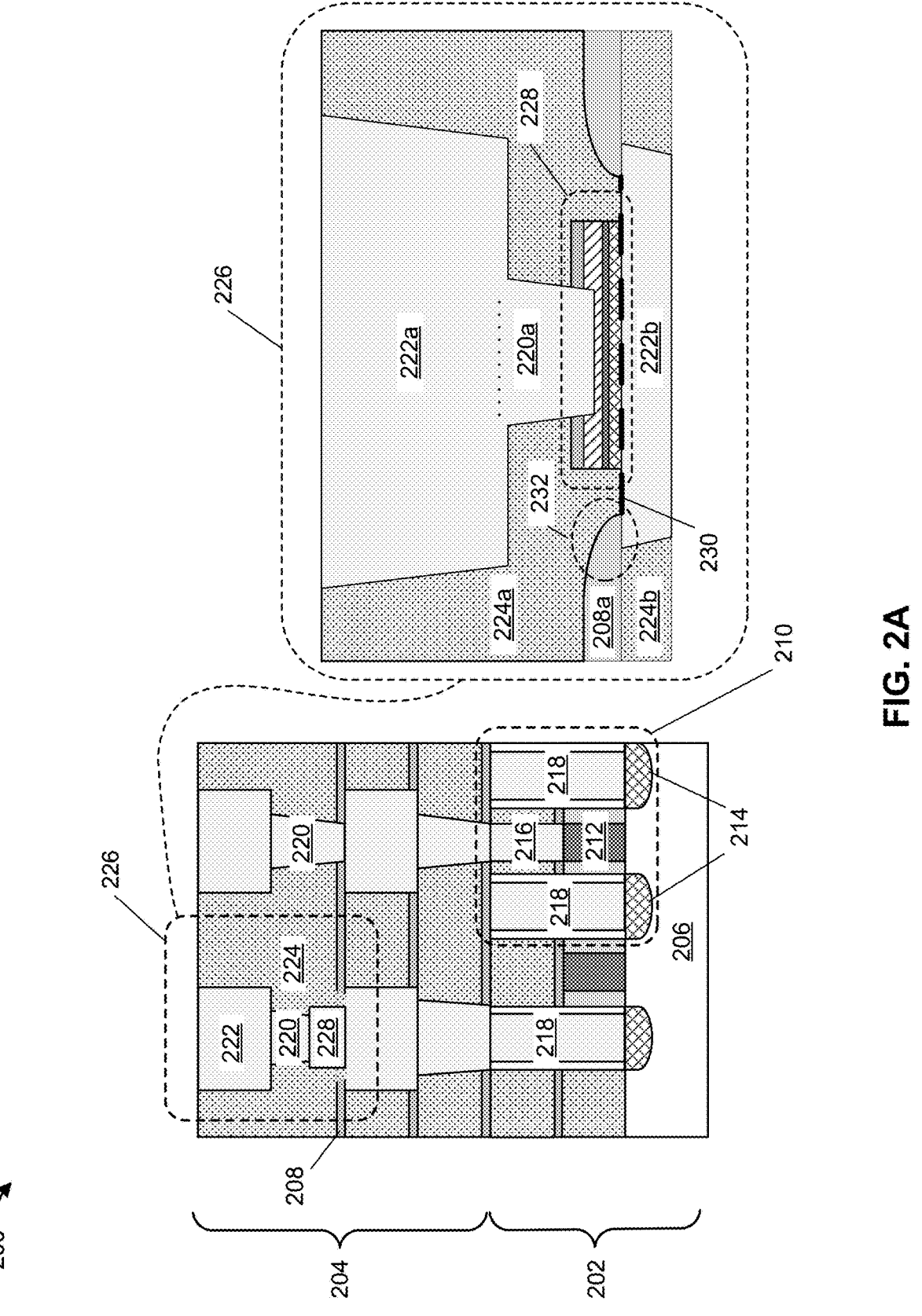
FIGS. 2A-2C are diagrams of an example device including a memory structure described herein.
Figure 2B:
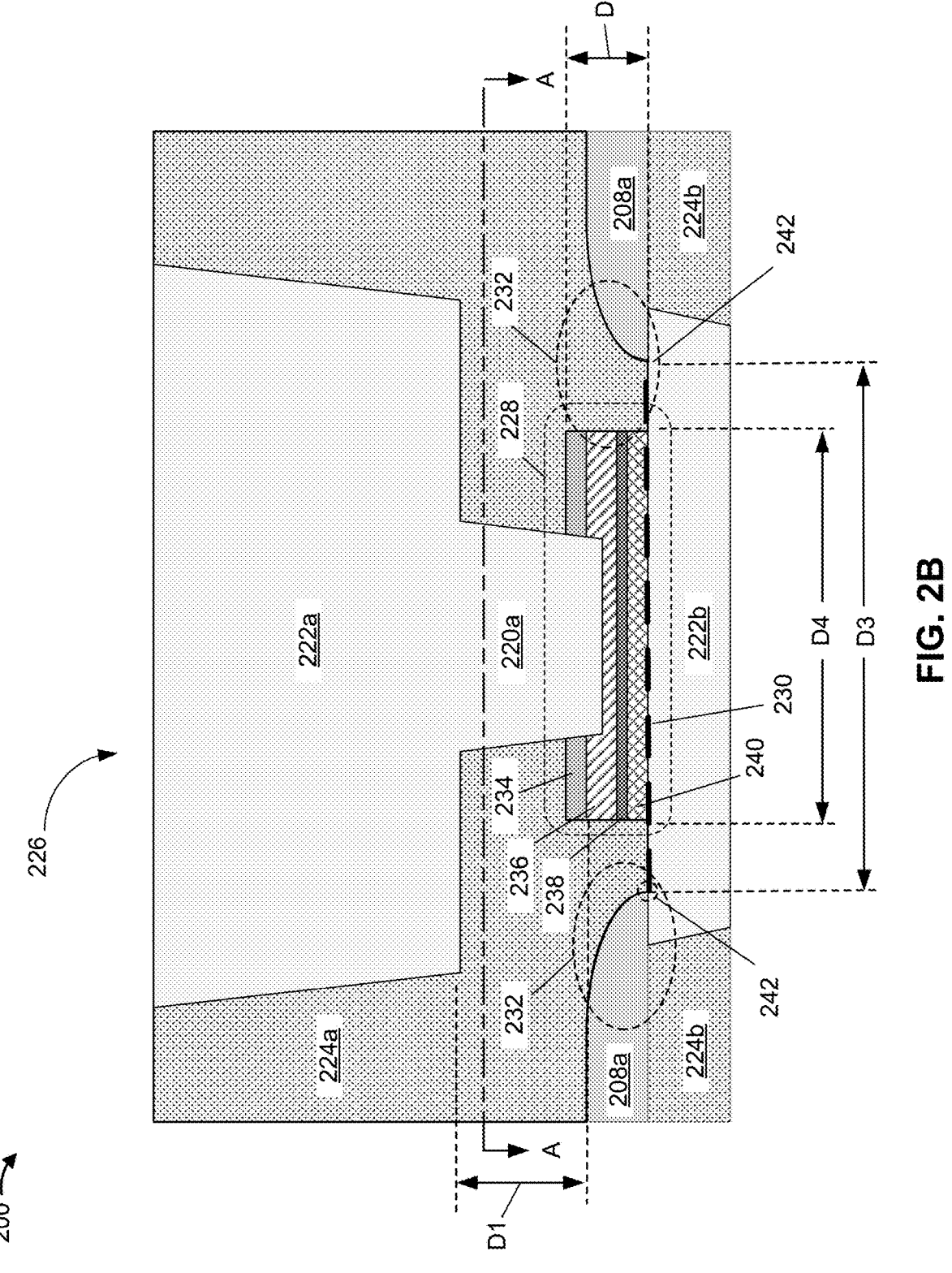
Figure 2C:
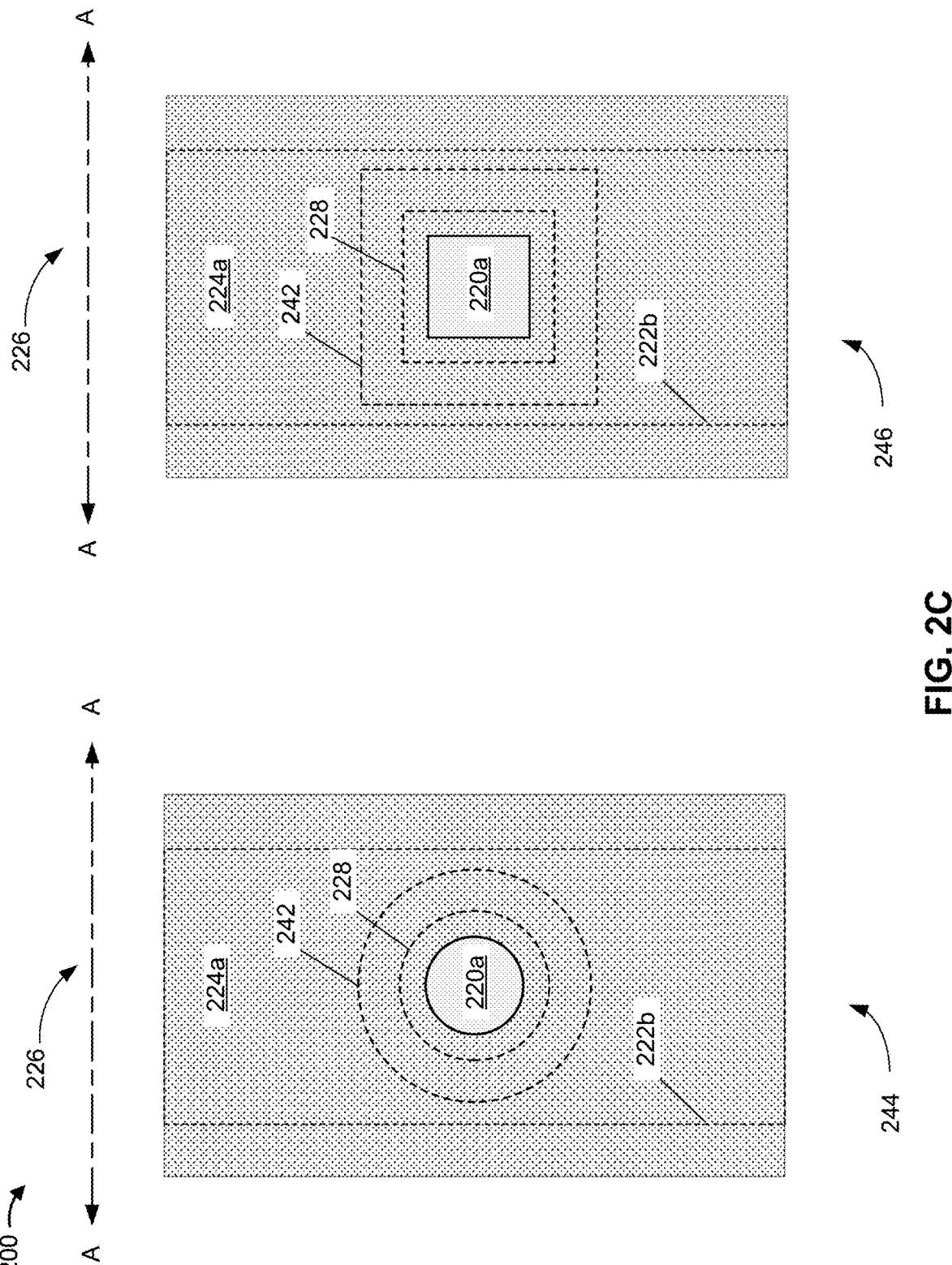

FIGS. 2A-2C are diagrams of an example device 200 including a memory structure described herein. Device 200 may correspond to an RRAM memory device.

As shown in the side view of FIG. 2A, the device 200 includes one or more regions, including an FEOL region 202 and a BEOL region 204. The FEOL region 202 may be formed within, and over a semiconductor substrate 206 (e.g., a silicon substrate). The BEOL region 204 may be over formed the FEOL region 202.

The FEOL region 202 and the BEOL region 204 may include structures formed from layers of dielectric materials interspersed with layers of conductive materials. Examples of dielectric materials include a silicon nitride ($Si_xN_y$) material, a silicon oxide ($SiO_x$) material, and/or another type of dielectric material. Examples of conductive materials include a cobalt (Co) material, a ruthenium (Ru) material, a titanium (Ti) material, a tungsten (W) material, a copper (Cu) material, and/or another conductive material.

In some implementations, and within the FEOL region 202 and/or the BEOL region 204, an etch-stop layer 208 may be between one or more layers of material. In some implementations, the etch-stop layer 208 corresponds to a dielectric layer. Additionally, or alternatively, the etch-stop layer 208a may include a silicon carbide (SiC) material, a silicon nitride (SiN) material, and/or a silicon oxycarbide (SiOC) material, among other examples.

As shown in FIG. 2A, the FEOL region 202 may include a transistor region 210. The transistor region 210 may include a gate structure 212 between source/drain structures 214. The gate structure 212 may include multiple layers of a conductive materials (e.g., metal materials) and/or one more layers of a dielectric material (e.g., spacers) that are adjacent to the multiple layers of conductive materials, among other examples. In some implementations, the gate structure 212 corresponds to a gate-all-around (GAA) structure. The source/drain structures 214 may include one or more layers of epitaxial materials doped with a p-type and/or an n-type dopant. The transistor region 210 may further include a gate contact structure 216 connected to the gate structure 212 and source/drain contact structures 218 connected to the source/drain structures 214. The gate contact structure 216 and/or the source/drain contact structures 218 may include multiple layers of a conductive materials (e.g., metal materials, among other examples).

The BEOL region 204, sometimes referred to as an interconnect region, may include one or more vertical interconnect access (via) structures 220 and one or more metal structures 222. Additionally, or alternatively, the BEOL region 204 may include one or more isolation layers 224 (e.g., layers of a dielectric material) to provide electrical isolation between one or more structures within the BEOL region 204. In some implementations, an upper portion of the BEOL region 204 may include a memory structure 226. The memory structure 226 may be electrically connected with a source/drain region 218 of a transistor in a transistor region 210.

As shown in the magnified detail of FIG. 2A, the memory structure 226 may include a cell structure 228 (e.g., an RRAM memory cell structure, a capacitor cell structure, or another cell structure, among other examples) that is between a metal structure 222a (e.g., a first metal structure, an upper metal structure, or an upper metal line structure, among other examples) and a metal structure 222b (e.g., a second metal structure, a lower metal structure, or a lower metal line structure, among other examples). The cell structure 228 may be on the landing region 230 of the metal structure 222*b* (e.g., on a top surface of the metal structure 222*b*).

The memory structure further includes the isolation layer 224*a* and the isolation layer 224*b*. The isolation layer 224*a* and/or the isolation layer 224*b* may include an extremely low-k (ELK) dielectric material (e.g., a material with a dielectric constant k of 2.5 or less). The ELK dielectric material may correspond to a silicon oxide-based material (SiO$_x$) having a porous structure, among other examples.

In some implementations, and as shown in the magnified detail view of FIG. 2A, the landing region 230 is adjacent to a convex-shaped surface 232 of the etch-stop layer 208*a*. The etch-stop layer 208*a* may include one or more convex-shaped surfaces 232 on opposite sides. During fabrication of the memory structure 226 including the cell structure 228, and as described in greater detail in connection with FIGS. 3A-5 and elsewhere herein, the metal structure 222*b* may perform as an etch-stop layer (e.g., in addition to the etch-stop layer 208*a*).

In some implementations, patterning and etching techniques that include using the metal structure 222*b* to perform as an etch-stop layer (while forming the cell structure 228) may reduce an overall height of the memory structure 226. For example, the overall height of the memory structure 226 may be reduced by up to approximately 150 units in comparison to patterning and etching techniques that us another structure or layer as an etch-stop layer while forming the cell structure 228.

FIG. 2B shows additional details of the memory structure 226. As shown in the side view of FIG. 2B, the cell structure 228 may include a hard mask structure 234, an insulator structure 238 and/or a lower electrode structure 240. In FIG. 2B, the vertical interconnect access structure 220*a* penetrates the hard mask structure 234 to connect the upper electrode structure 236 to the metal structure 222*a* (e.g., connect the upper electrode structure 236 to an upper metal line structure, among other examples).

As shown in FIG. 2B, the convex-shaped surface 232 includes a vertex 242 (e.g., an endpoint intersecting a surface) that is on (e.g., in contact with) the metal structure 222*b* at an edge of the landing region 230. In some implementations, the convex-shaped surface 232 overlaps a portion of the metal structure 222*b* at the edge of the landing region 230. Additionally, or alternatively and in some implementations, the convex-shaped surface 232 overlaps a portion of the isolation layer 224*b* that is adjacent to the metal structure 222*b*.

As shown in FIG. 2B, the etch-stop layer 208*a* may include the convex-shaped surface 232 on opposing sides of the cell structure 228. Accordingly, the landing region 230 may be between a first convex-shaped surface of the etch-stop layer 208*a* and a second convex-shaped surface of the etch-stop layer 208*a*. Additionally, or alternatively, an electrode structure (e.g., the lower electrode structure 240) is on the landing region 230.

As shown in FIG. 2B, the landing region the 230 may correspond to a first portion of a top surface of the metal structure 222*b* (e.g., a top surface of the lower metal line structure). Further, an as shown in FIG. 2B, a portion of a bottom surface of the etch-stop layer 208*a* may overlap, and be on, a second portion of the top surface of the metal structure 222*b* that is immediately adjacent to the first portion.

The memory structure 226 may include one or more dimensional properties. For example, a distance D10 (e.g., an isolation distance) between a bottom surface of the metal structure 222*a* and a top surface of the upper electrode structure 236 may be included in a range of approximately 350 Angstroms (Å) to approximately 650 Å. If the distance D1 is less than approximately 350 Å, a risk of electron tunneling (e.g., electrical shorting and/or leakage) between the metal structure 222*a* and the upper electrode structure 236 may increase. If the distance D1 is greater than approximately 650 Å, an overall height of the memory structure 226 may increase to render the memory structure 226 incompatible with a design of other structures within a device (e.g., the device 200) and hinder a reduction in a size of the device. However, other values and ranges for the distance D1 are within the scope of the present disclosure.

As another example, a thickness D2 of the cell structure 228 may be included in a range of approximately 300 Å to approximately 900 Å. If the thickness D2 is less than approximately 300 Å, an overall capacitance of the cell structure 228 may be insufficient for the cell structure 228 to perform as a memory cell. Additionally, or alternatively, if the thickness is greater than approximately 900 Å, an overall height of the memory structure 226 may increase to render the memory structure 226 incompatible with a design of other structures within a device (e.g., the device 200). Additionally, or alternatively, a risk for a functionality failure of the device 200 may increase. However, other values and ranges for the thickness D2 are within the scope of the present disclosure.

As another example, a width D3 of the landing region (e.g., a distance between the vertex(es) 242 of the convex-shaped surface(s) 232 adjacent to opposing sides of the cell structure 228) may be included in a range of approximately 70 nanometers to approximately 300 nanometers. Additionally, or alternatively, a width D4 of the cell structure 228 may be included in a range of 50 nanometers to approximately 200 nanometers. However, other values and ranges for the width D3 and the width D4 are within the scope of the present disclosure. In some implementations, the width D4 of the cell structure 228 may be less than a width of the metal structure 222*a* such that the cell structure 228 is within a perimeter of the metal structure 222*a* and does not extend outward from the metal structure 222*a*.

In some implementations, the width D4 is lesser relative to D3. Additionally, or alternatively and in some implementations, a width of the hard mask structure 234, a width of the upper electrode structure 236, a width of the insulator structure 238, and a width of the lower electrode structure 240 may each correspond to the width D4. In other words, an approximate width of the lower electrode structure 240 may correspond to an approximate width of the insulator structure 238, the approximate width of the insulator structure 238 may correspond to an approximate width of the upper electrode structure 236, and the approximate width of the upper electrode structure 236 may correspond to an approximate width of the hard mask structure 234.

As shown in FIG. 2B, the isolation layer 224*a* (e.g., a dielectric layer) contacts a segment of a top surface of the metal structure 222*b* between edges of one or more layers of the cell structure 228 and the vertex 242 of the convex-shaped surface 232. For example, the isolation layer 224*a* contacts the segment of the top surface of the metal structure 222*b* between the edge of the lower electrode structure 240 and the vertex 242 of the convex-shaped surface 232.

FIG. 2B includes a section line A-A. As described in connection with FIG. 2C, footprints (e.g., planar outlines, planar shapes) associated with the vertical interconnect access structure 220*a*, the cell structure 228, and/or the vertex 242 (e.g., corresponding to a footprint of the convex-shaped surface 232) may vary.

FIG. 2C shows example top views taken along the section line A-A of FIG. 2B. As shown in example 244, the vertical interconnect access structure 220a, the cell structure 228, and/or the vertex 242 may include circular footprints. In some implementations, manufacturing the vertical interconnect access structure 220a, the cell structure 228, and/or the vertex 242 (e.g., the convex-shaped surface 232) including circular footprints may accommodate a process capability (e.g., a tolerance stack) available through semiconductor manufacturing tools of a manufacturing environment (e.g., the semiconductor manufacturing tools 102-116 in the environment 100 of FIG. 1, among other examples) relative to other shaped footprints.

As shown in example 246 of FIG. 2C, the vertical interconnect access structure 220a, the cell structure 228, and/or the vertex 242 may include rectangular (e.g., square) footprints. In some implementations, manufacturing the vertical interconnect access structure 220a, the cell structure 228, and/or the vertex 242 (e.g., the convex-shaped surface 232) including rectangular footprints may increase performance of the memory structure 226 (e.g., increase a capacitance of the cell structure 228, among other examples) relative to other shaped footprints.

As described in greater detail in connection with FIGS. 3A-5, and elsewhere herein, the device 200 may correspond to a memory device (e.g., an RRAM memory device, among other examples). The memory device includes a lower metal line structure (e.g., the metal structure 222b). The memory device includes the cell structure 228 on the lower metal line structure. The memory device includes an upper metal line structure (e.g., the metal structure 222a) above the cell structure 228. The memory device includes the via structure 218a that connects the upper metal line structure to the cell structure 228. The memory device includes the etch-stop layer 208a including the convex-shaped surface 232 that is adjacent to the cell structure 228 and in contact with the lower metal line structure. The memory device includes the isolation layer 224a, where the isolation layer 224a is between a bottom surface of the upper metal line structure and the etch-stop layer 208a including the convex-shaped surface 232.

Additionally, or alternatively, the device 200 includes the metal structure 222b. The device 200 includes the cell structure 228 including an electrode structure on the metal structure 222b. The device 200 includes a first dielectric layer (e.g., the etch-stop layer 208a) including a convex-shaped surface 232 overlapping an edge region of the metal structure 222b. The device 200 includes a second dielectric layer (e.g., the isolation layer 224a), where the second dielectric layer is between the cell structure 228 and the convex-shaped surface 232.

The number and arrangement of devices shown in FIGS. 2A-2C are provided as one or more examples. In practice, there may be additional devices, fewer devices, different devices, or differently arranged devices than those shown in FIGS. 2A-2C. Furthermore, other devices may include features that differ from what is described with regard to FIGS. 2A-2C.

FIGS. 3A-3E are diagrams of an example manufacturing process 300 used to form the example memory structure 226 described herein. The example manufacturing process 300 may use one or more of the semiconductor processing tools 102-116 as described in connection with FIG. 1.

Figure 3A:
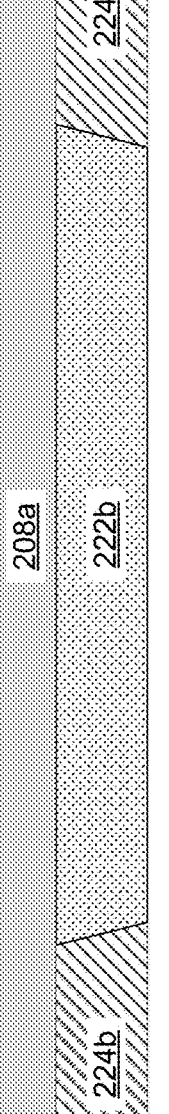
FIGS. 3A-3E are diagrams of an example manufacturing process used to form the example memory structure described herein.
Figure 3A:

As shown in FIG. 3A, and as part of a series of one or more operations 302, the etch-stop layer 208a is formed over and/or on the metal structure 222b and/or on the isolation layer 224b. The deposition tool 102 may deposit the etch-stop layer in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes the etch-stop layer 208a after the deposition tool 102 deposits the etch-stop layer 208a. The etch-stop layer 208a may include a dielectric material (e.g., a silicon carbide (SiC) material, a silicon nitride (SiN) material, and/or a silicon oxycarbide (SiOC) material, among other examples). The etch-stop layer 208a may be used in connection with one or more first etching operations used to form one or more portions of a device (e.g., one or more portions of the device 200).

Figure 3B:
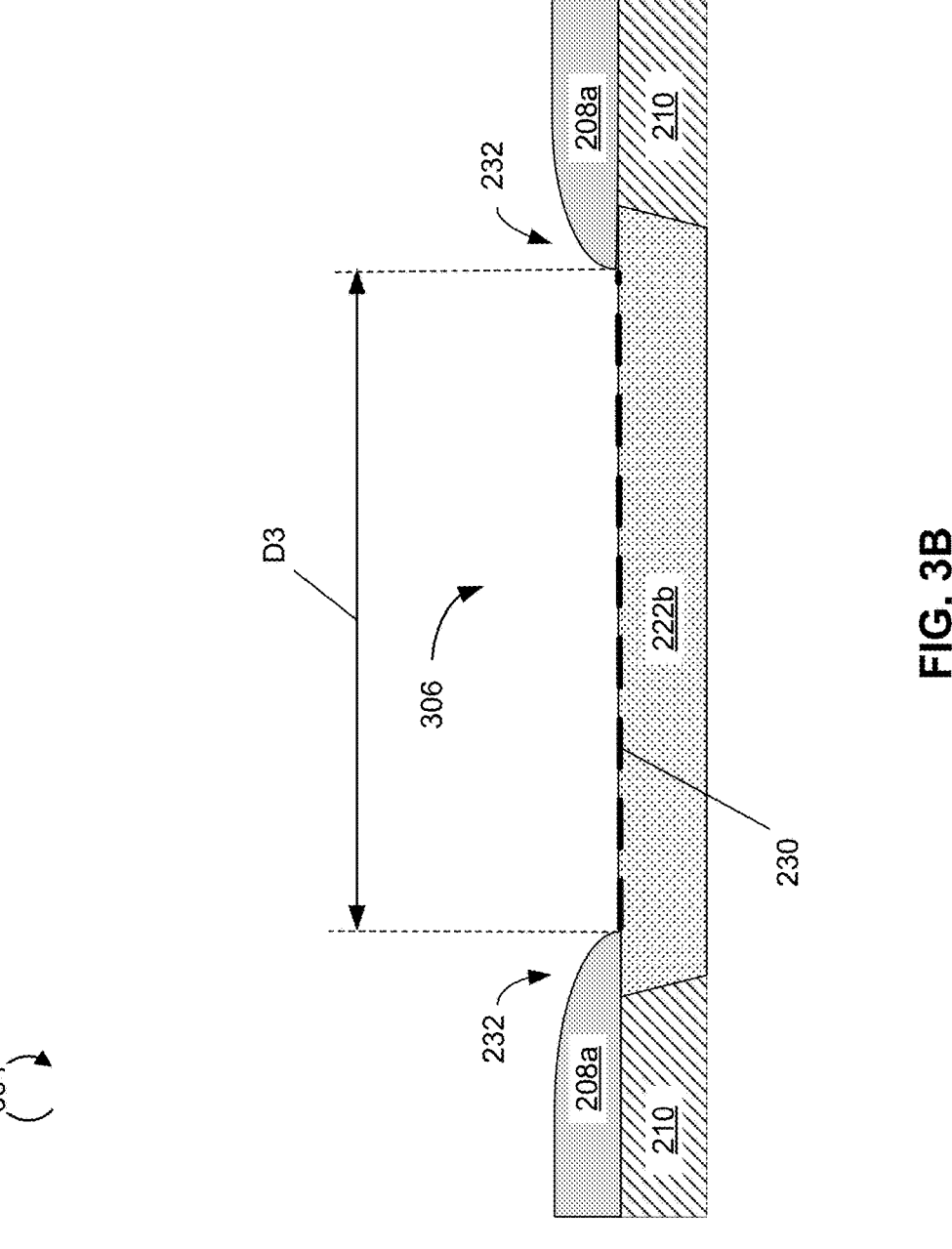

As shown in FIG. 3B, and as part of a series of one or more operations 304, an opening 306 that exposes the landing region 230 is formed. In some implementations, a pattern in a photoresist layer is used to etch the etch-stop layer 208a to form the opening 306. In these implementations, the deposition tool 102 forms the photoresist layer on the etch-stop layer 20a8 The exposure tool 104 exposes the photoresist layer to a radiation source to pattern the photoresist layer. The developer tool 106 develops and removes portions of the photoresist layer to expose the pattern. The etch tool 108 etches the etch-stop layer 208a based on the pattern to form the opening 306 in the etch-stop layer 208a. As part of the one or more operations 304, the etch tool 108 may form the convex-shaped surfaces 232. In a case where the etch-stop layer 208a includes an SiC material, for example, the etch-tool 108 may perform a dry-etch operation using a chlorine-based etchant to selectively remove portions of the etch-stop layer 208a to form the opening 306 and the convex-shaped surface(s) 232. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique). In some implementations, a hard mask layer is used as an alternative technique for etching the etch-stop layer based on a pattern. In some implementations, a photoresist removal tool removes the remaining portions of the photoresist layer (e.g., using a chemical stripper, plasma ashing, and/or another technique). As shown in FIG. 3B, the width D3 of the opening 306 corresponds to the width D3 of the landing region 230 as described in connection with FIG. 2B.

Figure 3C:
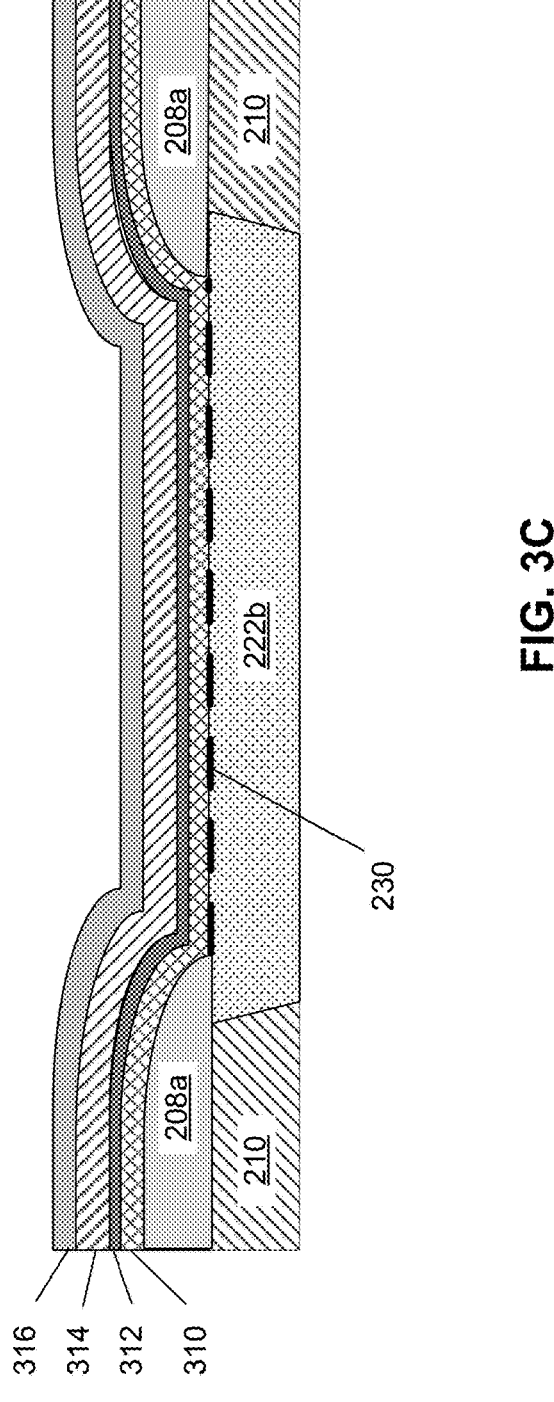

As shown in FIG. 3C, and as part of a series of one or more operations 308, a lower electrode layer 310 (e.g., a layer of a conductive material such as a tantalum (Ta) material, a titanium (Ti) material, a hafnium material (Hf), a ruthenium (Ru) material, an iridium (Ir) material, a molybdenum (Mo) material, and/or a tungsten (W) material, each with respective composite and nitridation materials, among other examples) formed on the landing region 230. Additionally, or alternatively, an insulator layer 312 (e.g., a layer of a high-k metal oxide material such as a as a tantalum (Ta) material, a titanium (Ti) material, a hafnium material (Hf), a ruthenium (Ru) material, an iridium (Ir) material, a molybdenum (Mo) material, and/or a tungsten (W) material, each with respective composite and oxidation materials, among other examples) is formed on the lower electrode layer 310. Additionally, or alternatively, an upper electrode layer 314

(e.g., a layer of a conductive material such as a tantalum (Ta) material, a titanium (Ti) material, a hafnium material (Hf), a ruthenium (Ru) material, an iridium (Ir) material, a molybdenum (Mo) material, or a tungsten (W) material, each with respective composite and nitridation materials, among other examples) is formed on the insulator layer 312. Additionally, or alternatively, a hard mask layer 316 (e.g., a layer of a dielectric material of a silicon carbide (SiC) material, a silicon nitride (SiN) material, a silicon oxycarbide (SiOC) material, or a) is formed on the upper electrode layer 314.

The deposition tool 102 and/or the plating tool 112 may deposit the layers 310-316 using one or more of a CVD operation, a PVD operation, an ALD operation, an electroplating operation, another deposition operation described above in connection with FIG. 1, and/or another suitable deposition operation. In some implementations, a seed layer is deposited prior to deposition of one of the layers 310-316. In some implementations, the planarization tool 110 planarizes the layers 310-316 after the deposition tool 102 and/or the plating tool 112 deposits the layers 310-316.

Figure 3D:
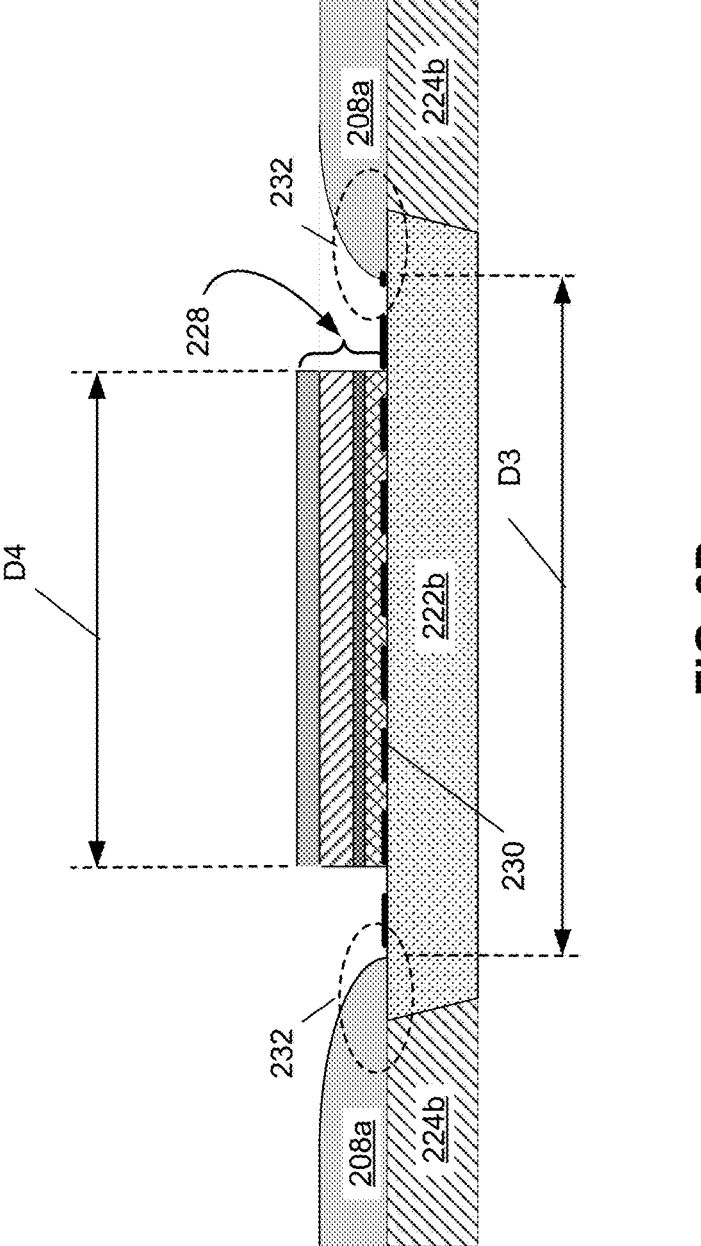

As shown in FIG. 3D, and as part of one or more operations 318, the cell structure 228 is formed on the metal structure 222b (e.g., within the landing region 230). As described in connection with FIG. 2B, the cell structure 228 may be formed to include the width D4.

In some implementations, a pattern in a photoresist layer is used to etch the layers 310-316 to form the cell structure 228. In these implementations, the deposition tool 102 forms the photoresist layer on the hard mask layer 316. The exposure tool 104 exposes the photoresist layer to a radiation source to pattern the photoresist layer. The developer tool 106 develops and removes portions of the photoresist layer to expose the pattern. In particular, the etch tool 108 may remove portions of lower electrode layer 310 to form the lower electrode structure 240. Additionally, or alternatively, the etch tool 108 may remove portions of the insulator layer 312 to form the insulator structure 238. Additionally, or alternatively, the etch tool 108 may remove portions of the upper electrode layer 314 to form the upper electrode structure 236. Additionally, or alternatively, the etch tool the 108 may remove portions of the hard mask layer 316 to form the hard mask structure 234. In some implementations, a photoresist removal tool removes the remaining portions of the photoresist layer (e.g., using a chemical stripper, plasma ashing, and/or another technique). In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique). In some implementations, an additional hard mask layer is used as an alternative technique for etching the layers 310-316 based on a pattern. In some implementations, a photoresist removal tool removes the remaining portions of the photoresist layer (e.g., using a chemical stripper, plasma ashing, and/or another technique).

In FIG. 3D, the metal structure 222b is used as a direct landing for the cell structure 228 and as an etch stop. Use of the metal structure 222b in this manner may allow a memory structure (e.g., the memory structure 226) including the cell structure 228 to decreased without increasing a risk of electron tunneling between the cell structure 228 (e.g., the upper electrode structure 236) and another feature of the memory structure (e.g., the metal structure 222a).

Figure 3E:
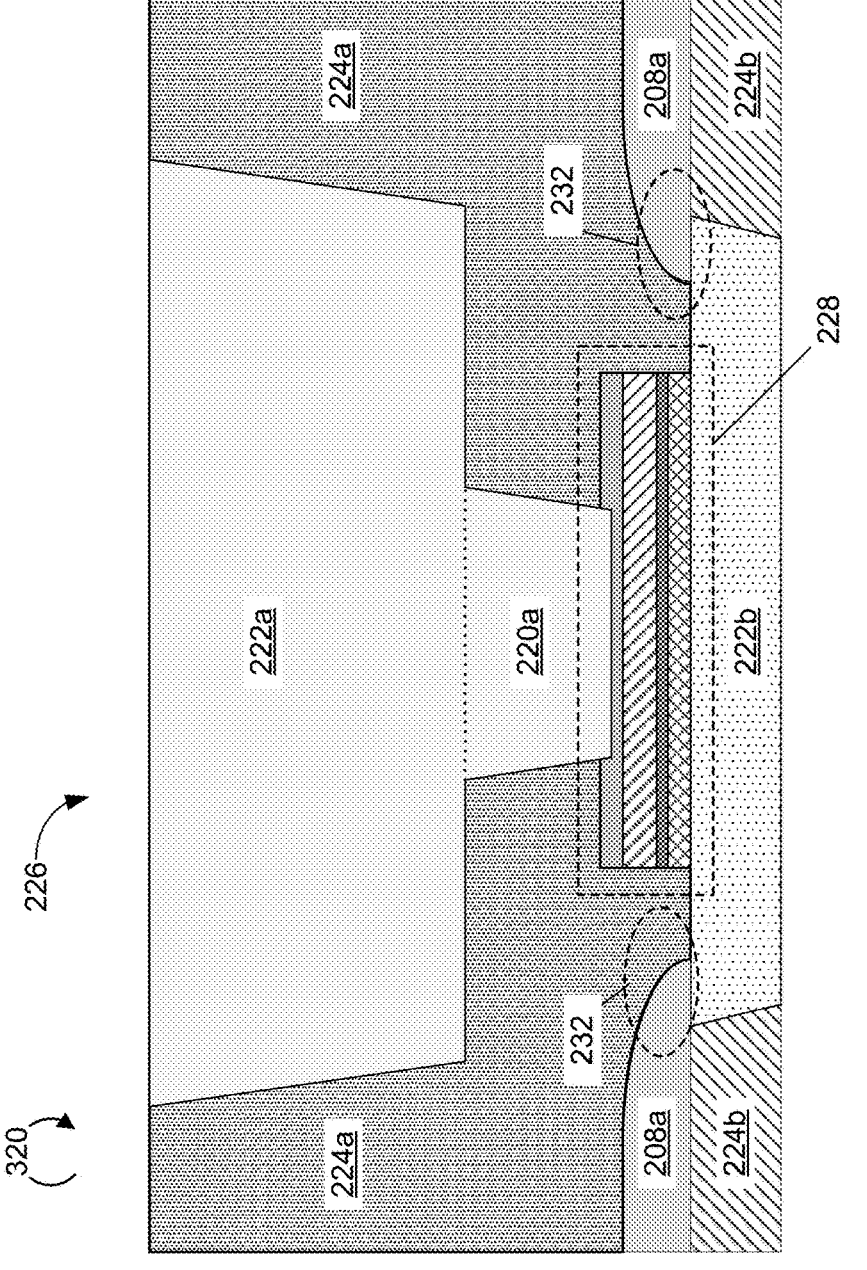

As shown in FIG. 3E, a series of one or more operations 322 forms the memory structure 226. For example, the series of one or more operations 322 may include the deposition tool 102 depositing the isolation layer 224a (e.g., a dielectric material) in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes the isolation layer 224a after the deposition tool 102 deposits the isolation layer 224a.

Additionally, or alternatively and as part of the series of operations 322, a pattern in a photoresist layer is used to etch the isolation layer 224a to form recesses for the vertical interconnect access structure 220a and/or the metal structure 222a. In these implementations, the deposition tool 102 forms the photoresist layer on the isolation layer 224a. The exposure tool 104 exposes the photoresist layer to a radiation source to pattern the photoresist layer. The developer tool 106 develops and removes portions of the photoresist layer to expose the pattern. The etch tool 108 etches the isolation layer 224a based on the pattern to form the recesses for the vertical interconnect access structure 220a and/or the metal structure 222a in the isolation layer 224a. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique). In some implementations, a hard mask layer is used as an alternative technique for etching the recesses based on a pattern. In some implementations, a photoresist removal tool removes the remaining portions of the photoresist layer (e.g., using a chemical stripper, plasma ashing, and/or another technique).

As shown in FIG. 3E, and as part of a series of one or more operations 322, the vertical interconnect access structure 220a and the metal structure 222a may be formed in the recesses. The deposition tool 102 may deposit a conductive material (a conductive material such as a cobalt (Co) material, a ruthenium (Ru) material, a titanium (Ti) material, a tungsten (W) material, or a copper (Cu) material, among other examples) in the recesses to form the vertical interconnect access structure 220a and/or the metal structure 222a in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes the conductive materials after deposition.

The manufacturing process 300 as shown in FIGS. 3A-3E may be varied and/or modified. For example, the manufacturing process 300 may be modified to include a dual damascene process, during which vias and other features (e.g., trenches) of the device 200 are be patterned in such a way that the vias and other features are filled simultaneously by the deposition tool 102.

As indicated above, FIGS. 3A-3E are provided as examples. Other examples may differ from what is described with regard to FIGS. 3A-3E.

Figure 4:
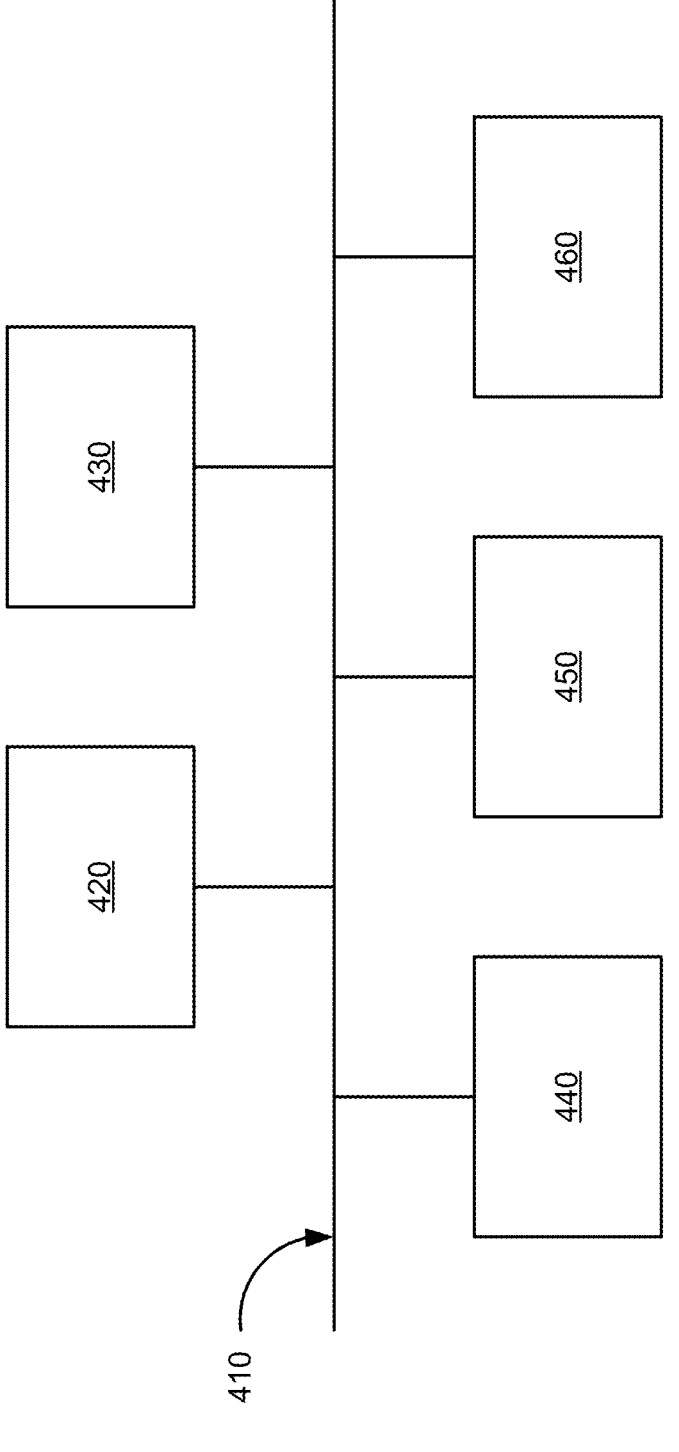
FIG. 4 is a diagram of example components of one or more devices of FIG. 1 described herein.

FIG. 4 is a diagram of example components of a device 400 associated with semiconductor device and methods of manufacturing. Device 400 may correspond to one or more of the semiconductor processing tools 102-116. In some implementations, one or more of the semiconductor processing tools 102-116 may include one or more devices 400 and/or one or more components of device 400. As shown in FIG. 4, device 400 may include a bus 410, a processor 420, a memory 430, an input component 440, an output component 450, and a communication component 460.

Bus 410 may include one or more components that enable wired and/or wireless communication among the components of device 400. Bus 410 may couple together two or more components of FIG. 4, such as via operative coupling, communicative coupling, electronic coupling, and/or electric coupling. Processor 420 may include a central processing unit, a graphics processing unit, a microprocessor, a controller, a microcontroller, a digital signal processor, a field-programmable gate array, an application-specific integrated circuit, and/or another type of processing component. Processor 420 is implemented in hardware, firmware, or a combination of hardware and software. In some implementations, processor 420 may include one or more processors capable of being programmed to perform one or more operations or processes described elsewhere herein.

Memory 430 may include volatile and/or nonvolatile memory. For example, memory 430 may include random access memory (RAM), read only memory (ROM), a hard disk drive, and/or another type of memory (e.g., a flash memory, a magnetic memory, and/or an optical memory). Memory 430 may include internal memory (e.g., RAM, ROM, or a hard disk drive) and/or removable memory (e.g., removable via a universal serial bus connection). Memory 430 may be a non-transitory computer-readable medium. Memory 430 stores information, instructions, and/or software (e.g., one or more software applications) related to the operation of device 400. In some implementations, memory 430 may include one or more memories that are coupled to one or more processors (e.g., processor 420), such as via bus 410.

Input component 440 enables device 400 to receive input, such as user input and/or sensed input. For example, input component 440 may include a touch screen, a keyboard, a keypad, a mouse, a button, a microphone, a switch, a sensor, a global positioning system sensor, an accelerometer, a gyroscope, and/or an actuator. Output component 450 enables device 400 to provide output, such as via a display, a speaker, and/or a light-emitting diode. Communication component 460 enables device 400 to communicate with other devices via a wired connection and/or a wireless connection. For example, communication component 460 may include a receiver, a transmitter, a transceiver, a modem, a network interface card, and/or an antenna.

Device 400 may perform one or more operations or processes described herein. For example, a non-transitory computer-readable medium (e.g., memory 430) may store a set of instructions (e.g., one or more instructions or code) for execution by processor 420. Processor 420 may execute the set of instructions to perform one or more operations or processes described herein. In some implementations, execution of the set of instructions, by one or more processors 420, causes the one or more processors 420 and/or the device 400 to perform one or more operations or processes described herein. In some implementations, hardwired circuitry is used instead of or in combination with the instructions to perform one or more operations or processes described herein. Additionally, or alternatively, processor 420 may be configured to perform one or more operations or processes described herein. Thus, implementations described herein are not limited to any specific combination of hardware circuitry and software.

The number and arrangement of components shown in FIG. 4 are provided as an example. Device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

Figure 5:
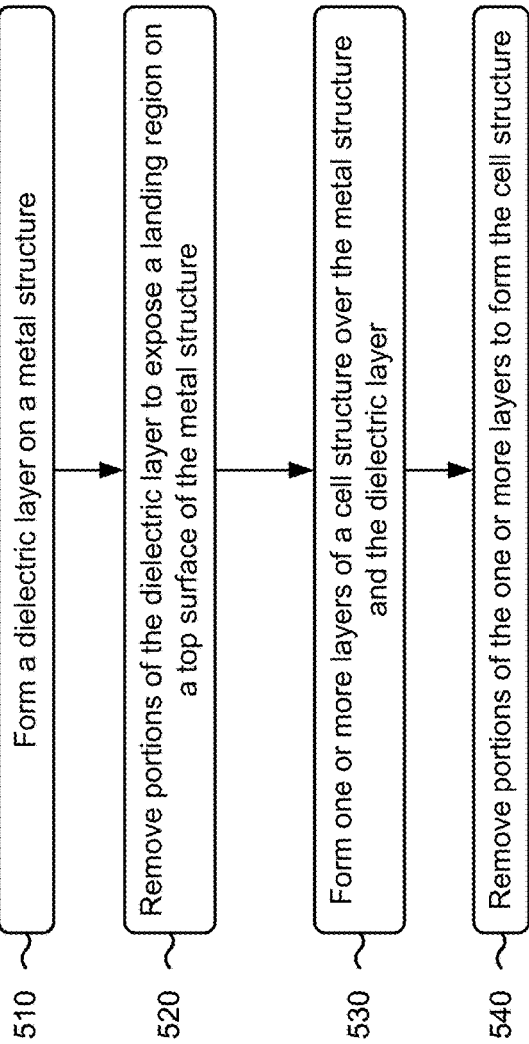
FIG. 5 is a flowchart of an example process associated with forming the example memory structure described herein.

FIG. 5 is a flowchart of an example process 500 associated with semiconductor device and methods of manufacturing. In some implementations, one or more process blocks of FIG. 5 are performed by one or more of the semiconductor processing tools 102-116. Additionally, or alternatively, one or more process blocks of FIG. 5 may be performed by one or more components of device 400, such as processor 420, memory 430, input component 440, output component 450, and/or communication component 460.

As shown in FIG. 5, process 500 may include forming a dielectric layer on a metal structure (block 510). For example, the deposition tool the deposition tool 102, or another similar tool, may perform an operation to form a dielectric layer (e.g., the etch-stop layer 208*a*) on a metal structure 220*b*, as described above.

As further shown in FIG. 5, process 500 may include removing portions of the dielectric layer to expose a landing region on a top surface of the metal structure (block 520). For example, the etch tool 108 may remove portions of the dielectric layer to expose a landing region 230 on a top surface of the metal structure 222*b*, as described above. In some implementations, removing the portions of the dielectric layer forms convex-shaped surfaces 232 in the dielectric layer that are adjacent to the landing region. In some implementations, the convex-shaped surfaces 232 overlap edges of the metal structure 222*b*.

As further shown in FIG. 5, process 500 may include forming one or more layers of a cell structure over the metal structure and the dielectric layer (block 530). For example, the deposition tool 102 may form one or more layers (e.g., the layers 310-316) of a cell structure 228 over the metal structure 222*b* and the dielectric layer, as described above. In some implementations, a bottom layer of the one or more layers (e.g., the lower electrode layer 310) is on the landing region 320 and the dielectric layer.

As further shown in FIG. 5, process 500 may include removing portions of the one or more layers to form the cell structure (block 540). For example, the etch tool 108 may remove portions of the one or more layers (e.g., the layers 310-316) to form the cell structure 228, as described above.

Process 500 may include additional implementations, such as any single implementation or any combination of implementations described below and/or in connection with one or more other processes described elsewhere herein.

In a first implementation, removing the portions of the dielectric layer to expose the landing region 230 on the top surface of the metal structure 222*b* includes removing the portions of the dielectric layer to form the landing region 230 to a first width (e.g., the width D3), and where removing the portions of the one or more layers (e.g., the layers 310-316) to form the cell structure 228 includes removing the portions to form the cell structure to a second width (e.g., the width D4) that is lesser relative to the first width.

In a second implementation, alone or in combination with the first implementation, removing the portions to form the cell structure 228 to a second width that is lesser relative to the first width includes removing portions of a hard mask layer 316, an upper electrode layer 314, an insulator layer 312, and a lower electrode layer 310, where remaining portions of the hard mask layer 316, the upper electrode layer 314, the insulator layer 312, and the lower electrode layer 310 each have a width that corresponds to the second width.

In a third implementation, alone or in combination with one or more of the first and second implementations, the metal structure 222b performs as an etch stop during the removing of the portions of the one or more layers (e.g., the layers 310-316) to form the cell structure 228.

In a fourth implementation, alone or in combination with one or more of the first through third implementations, process 500 includes forming a vertical interconnect access structure 220a above and between the convex-shaped surfaces 232.

In a fifth implementation, alone or in combination with one or more of the first through fourth implementations, forming the vertical interconnect access structure 220a above and between the convex-shaped surfaces 232 includes forming the vertical interconnect access structure 220a through a hard mask structure 234 that is above and between the convex-shaped surfaces 232 to connect with an upper electrode structure 236 of the cell structure 228, where the cell structure 228 is on the landing region 230 and between vertexes 242 of the convex-shaped surfaces 232.

Although FIG. 5 shows example blocks of process 500, in some implementations, process 500 includes additional blocks, fewer blocks, different blocks, or differently arranged blocks than those depicted in FIG. 5. Additionally, or alternatively, two or more of the blocks of process 500 may be performed in parallel.

Some implementations described herein include a memory device and techniques of formation. A cell structure of the memory device includes an upper electrode structure that is separated from a metal line structure above the cell structure by a combination of one or more layers including an isolation layer. The techniques include patterning the cell structure using a metal line structure below the cell structure as an etch-stop layer.

Relative to other techniques that include patterning the cell structure using a silicon carbide layer located over the metal line below the cell structure as an etch-stop layer, techniques that include patterning the cell structure using the metal line below the cell structure as an etch-stop layer may reduce an overall height of the memory structure. Additionally, or alternatively, the techniques may maintain or increase an isolation distance between the metal line and the electrode structure. In this way, a likelihood of shorting between the metal line and the electrode structure is reduced to improve a performance and/or a reliability of the memory device.

As described in greater detail above, some implementations described herein provide a memory device. The memory device includes a lower metal line structure. The memory device includes a cell structure on the lower metal line structure, the cell structure being adjacent to an etch-stop layer that has a convex-shaped upper surface and an approximately flat lower surface. The memory device includes an upper metal line structure above the cell structure. The memory device includes a vertical interconnect access structure that connects the upper metal line structure to the cell structure, where an isolation layer extends laterally between the cell structure and the convex-shaped upper surface of the etch stop layer.

As described in greater detail above, some implementations described herein provide a device. The device includes a metal structure, where a first dielectric layer that includes a convex-shaped upper surface and an approximately flat lower surface that overlaps an edge region of the metal structure. The device includes a cell structure that includes an electrode structure on the metal structure, where a second dielectric layer, that surrounds the metal structure, is included between the cell structure and the convex-shaped upper surface of the first dielectric layer.

As described in greater detail above, some implementations described herein provide a method. The method includes forming a dielectric layer on a metal structure. The method includes removing portions of the dielectric layer to expose a landing region on a top surface of the metal structure, where removing the portions of the dielectric layer forms convex-shaped surfaces in the dielectric layer that are adjacent to the landing region, and where the convex-shaped surfaces overlap edges of the metal structure. The method includes forming one or more layers of a cell structure over the metal structure and the dielectric layer, where a bottom layer of the one or more layers is on the landing region and on the dielectric layer. The method includes removing portions of the one or more layers to form the cell structure.

As used herein, the term "and/or," when used in connection with a plurality of items, is intended to cover each of the plurality of items alone and any and all combinations of the plurality of items. For example, "A and/or B" covers "A and B," "A and not B," and "B and not A."

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
 a lower metal line structure;
 a cell structure on the lower metal line structure,
  wherein the cell structure is adjacent to an etch-stop layer that has a convex-shaped upper surface and an approximately flat lower surface;
 an upper metal line structure above the cell structure; and
 a vertical interconnect access structure that connects the upper metal line structure to the cell structure,
  wherein an isolation layer extends laterally between the cell structure and the convex-shaped upper surface of the etch stop layer.

2. The memory device of claim 1,
 wherein the cell structure comprises:
  an upper electrode structure, and
  wherein a distance between a top surface of the upper electrode structure and a bottom surface of the upper metal line structure is included in a range of approximately 350 angstroms to approximately 650 angstroms.

3. The memory device of claim 1,
 wherein a thickness of the cell structure is included in a range of approximately 300 angstroms to approximately 900 angstroms.

4. The memory device of claim 1,
 wherein the convex-shaped upper surface corresponds to a first convex-shaped upper surface that is adjacent to a first side of the cell structure and further comprising:

a second convex-shaped upper surface that is adjacent to a second side of the cell structure that is opposite the first side, and a landing region on a top surface of the lower metal line structure, wherein the landing region is between the first convex-shaped upper surface and the second convex-shaped upper surface.

5. The memory device of claim 1, wherein the cell structure comprises:

an electrode structure on a landing region on a top surface of the lower metal line structure, wherein the electrode structure is on a landing region corresponding to a first portion of a top surface of the lower metal line structure, and wherein a least a portion of a bottom surface of the etch-stop layer overlaps, and is on, a second portion of the top surface of the lower metal line structure that is immediately adjacent to the first portion.

6. The memory device of claim 5, wherein a width of the cell structure is lesser relative to a width of the landing region.

7. The memory device of claim 5, wherein a width of the landing region is lesser relative to a width of the lower metal line structure.

8. The memory device of claim 5, wherein the electrode structure corresponds to a lower electrode structure and wherein the cell structure further comprises:

an insulator structure on the lower electrode structure, an upper electrode structure on the insulator structure, and a hard mask on the upper electrode structure, wherein the vertical interconnect access structure penetrates the hard mask to connect the upper electrode structure to the upper metal line structure.

9. The memory device of claim 8, wherein an approximate width of the lower electrode structure corresponds to an approximate width of the insulator structure, wherein the approximate width of the insulator structure corresponds to an approximate width of the upper electrode structure, and wherein the approximate width of the upper electrode structure corresponds to an approximate width of the hard mask.

10. A device, comprising:

a metal structure, wherein a first dielectric layer comprising a convex-shaped upper surface and an approximately flat lower surface that overlaps an edge region of the metal structure; and a cell structure comprising an electrode structure on the metal structure, and wherein a second dielectric layer, that surrounds the metal structure, is included between the cell structure and the convex-shaped upper surface of the first dielectric layer.

11. The device of claim 10, wherein the convex-shaped upper surface overlaps an edge region of a third dielectric layer adjacent to the metal structure.

12. The device of claim 10, wherein the first dielectric layer comprises a silicon carbide material that is configured to perform as an etch stop for a first etching operation, and wherein the metal structure comprises a copper material that is configured to perform as an etch stop for a second etching operation.

13. The device of claim 10, wherein the second dielectric layer contacts a segment of a top surface of the metal structure between an edge of the electrode structure and a vertex of the convex-shaped upper surface.

14. The device of claim 13, wherein the vertex of the convex-shaped upper surface is on a top surface of the metal structure.

15. A method, comprising:

forming a dielectric layer on a metal structure;

removing portions of the dielectric layer to expose a landing region on a top surface of the metal structure, wherein removing the portions of the dielectric layer forms convex-shaped surfaces in the dielectric layer that are adjacent to the landing region, and wherein the convex-shaped surfaces overlap edges of the metal structure;

forming one or more layers of a cell structure over the metal structure and the dielectric layer, wherein a bottom layer of the one or more layers is on the landing region and the dielectric layer; and removing portions of the one or more layers to form the cell structure, wherein removing the portions of the dielectric layer to expose the landing region on the top surface of the metal structure comprises:

removing the portions of the dielectric layer to form the landing region to a first width, and wherein removing the portions of the one or more layers to form the cell structure comprises:

removing the portions to form the cell structure to a second width that is lesser relative to the first width.

16. The method of claim 15, wherein removing the portions to form the cell structure to a second width that is lesser relative to the first width comprises:

removing portions of a hard mask layer, an upper electrode layer, an insulator layer, and a lower electrode layer, wherein remaining portions of the hard mask layer, the upper electrode layer, the insulator layer, and the lower electrode layer each have a width that corresponds to the second width.

17. A method, comprising:

forming a dielectric layer on a metal structure;

removing portions of the dielectric layer to expose a landing region on a top surface of the metal structure, wherein removing the portions of the dielectric layer forms convex-shaped surfaces in the dielectric layer that are adjacent to the landing region, and wherein the convex-shaped surfaces overlap edges of the metal structure;

forming one or more layers of a cell structure over the metal structure and the dielectric layer, wherein a bottom layer of the one or more layers is on the landing region and the dielectric layer; and removing portions of the one or more layers to form the cell structure, wherein the metal structure performs as an etch stop during the removing of the portions of the one or more layers to form the cell structure.

18. The method of claim 17, further comprising:

forming a vertical interconnect access structure above and between the convex-shaped surfaces.

19. The method of claim 18, wherein forming the vertical interconnect access structure above and between the convex-shaped surfaces comprises:

forming the vertical interconnect access structure through a hard mask structure that is above and between the convex-shaped surfaces to connect with an upper electrode structure of the cell structure, wherein the cell structure is on the landing region and between vertexes of the convex-shaped surfaces.

20. The method of claim 17, wherein a width of the cell structure is lesser relative to a width of the landing region, or wherein a width of the landing region is lesser relative to a width of a lower metal line structure.

* * * * *